US012683569B2

(12) United States Patent
Kitazume

(10) Patent No.: US 12,683,569 B2
(45) Date of Patent: Jul. 14, 2026

(54) FILTER, MULTIPLEXER, AND MULTILAYER ELECTRONIC COMPONENT

(71) Applicant: TAIYO YUDEN CO., LTD., Tokyo (JP)

(72) Inventor: Hidenori Kitazume, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 119 days.

(21) Appl. No.: 18/617,406

(22) Filed: Mar. 26, 2024

(65) Prior Publication Data

US 2024/0333244 A1 Oct. 3, 2024

(30) Foreign Application Priority Data

Mar. 29, 2023 (JP) ................................. 2023-053703

(51) Int. Cl.
| | |
|---|---|
| *H03H 7/01* | (2006.01) |
| *H01F 27/28* | (2006.01) |
| *H01G 4/30* | (2006.01) |
| *H03H 7/48* | (2006.01) |
| *H03H 1/00* | (2006.01) |

(52) U.S. Cl.
CPC ....... *H03H 7/0115* (2013.01); *H01F 27/2804* (2013.01); *H01G 4/30* (2013.01); *H03H 7/48* (2013.01); *H01F 2027/2809* (2013.01); *H03H 2001/0085* (2013.01)

(58) Field of Classification Search
CPC . H03H 2001/0085; H03H 7/0115; H03H 7/48
USPC ...................................................... 333/175, 185
See application file for complete search history.

(56) References Cited

U.S. PATENT DOCUMENTS

| | | | | |
|---|---|---|---|---|
| 6,222,427 B1 * | 4/2001 | Kato | ......................... | H01G 4/40 |
| | | | | 333/184 |
| 2019/0074571 A1 * | 3/2019 | Dekosky | ................... | H01P 1/30 |

FOREIGN PATENT DOCUMENTS

| | | |
|---|---|---|
| JP | H05-57816 U | 7/1983 |
| JP | H05-47591 A | 2/1993 |
| JP | 2002-313670 A | 10/2002 |

* cited by examiner

*Primary Examiner* — Rakesh B Patel
(74) *Attorney, Agent, or Firm* — CHEN YOSHIMURA LLP

(57) ABSTRACT

A filter includes a multilayer body in which a plurality of dielectric layers and a plurality of conductor layers are alternately stacked in a stack direction, an inductor including a first conductor pattern formed of at least one of the plurality of conductor layers, and a second conductor pattern provided in the multilayer body, the second conductor pattern being not connected to other conductors in the multilayer body, $X \leq 7.5 \times 10^7/(fc \times \sqrt{\varepsilon r})$ being satisfied where a maximum width of the second conductor pattern is X (m), a frequency at a high-frequency end of a passband is fc (Hz), and a relative permittivity of the plurality of dielectric layers is εr.

11 Claims, 15 Drawing Sheets

INDUCTOR A

INDUCTOR B

INDUCTOR C

INDUCTOR D

INDUCTOR E

FREQUENCY [GHz]

FILTER, MULTIPLEXER, AND MULTILAYER ELECTRONIC COMPONENT

FIELD

A certain aspect of the present disclosure relates to a filter, a multiplexer, and a multilayer electronic component.

BACKGROUND

A multilayer electronic component is known in which a capacitor and an inductor or filter are formed using a multilayer body in which dielectric layers and conductor layers are stacked. It is known to provide a floating conductor layer such as a dummy electrode in the multilayer body as disclosed in, for example, Japanese Patent Application Laid-Open Nos. H05-47591 and 2002-313670 (Patent Documents 1 and 2), and Japanese Utility Model Laid-Open No. H05-57816 (Patent Document 3).

RELATED ART DOCUMENTS

Patent Documents

Japanese Patent Application Laid-Open No. H05-47591
Japanese Patent Application Laid-Open No. 2002-313670
Japanese Utility Model Laid-Open No. H05-57816

SUMMARY

By forming a floating conductor layer, for example, diffusion of silver or the like from the conductor layer to the dielectric layer in the multilayer body can be reduced. However, when the floating conductor layer is provided, the characteristics of the capacitor and the inductor or filter may be degraded.

The present disclosure has been made in view of the above problems, and an object of the present disclosure is to reduce deterioration in characteristics.

In one aspect of the present disclosure, there is provided a filter including: a multilayer body in which a plurality of dielectric layers and a plurality of conductor layers are alternately stacked in a stack direction; an inductor including a first conductor pattern formed of at least one of the plurality of conductor layers; and a second conductor pattern provided in the multilayer body, the second conductor pattern being not connected to other conductors in the multilayer body, $X \leq 7.5 \times 10^7/(fs \times \sqrt{\varepsilon r})$ being satisfied where a maximum width of the second conductor pattern is $X$ (m), a frequency at a high-frequency end of a passband of the filter is $fc$ (Hz), and a relative permittivity of the plurality of dielectric layers is $\varepsilon r$.

In the above filter, the second conductor pattern may be formed of a via conductor layer penetrating through at least one of the plurality of dielectric layers.

In the above filter, the frequency at the high-frequency end of the passband may be 1 GHz or higher.

In the above filter, the second conductor pattern may not overlap the first conductor pattern when viewed from the stack direction.

In the above filter, the plurality of conductor layers and the second conductor pattern may be mainly composed of the same element.

In the above filter, the plurality of conductor layers and the second conductor pattern may contain silver.

In the above filter, the second conductor pattern may be formed of a via conductor layer that penetrates through at least one of adjacent dielectric layers with the first conductor pattern interposed therebetween among the plurality of dielectric layers.

In the above filter, the second conductor pattern may be formed of at least one of the following: a conductor layer on which the first conductor pattern is formed, and a conductor layer provided on a first surface of a first dielectric layer adjacent to the conductor layer of the plurality of dielectric layers, the first surface being opposite from a second surface, on which the first conductor pattern is provided, of the first dielectric layer.

In the above filter, the filter may be a low-pass filter or a bandpass filter.

In another aspect of the present disclosure, there is provided a multiplexer including the above filter.

In another aspect of the present disclosure, there is provided a multilayer electronic component including: a multilayer body in which a plurality of dielectric layers and a plurality of conductor layers are alternately stacked in a stack direction; an inductor including a first conductor pattern formed of at least one of the plurality of conductor layers; and a second conductor pattern provided in the multilayer body, the second conductor pattern being not connected to other conductors in the multilayer body, $X \leq 10 \times 10^7/(fs \times \sqrt{\varepsilon r})$ being satisfied where a maximum width of the second conductor layer is $X$ (m), a self-resonant frequency of the inductor is $fs$ (Hz), and a relative permittivity of the plurality of dielectric layers is $\varepsilon r$.

In another aspect of the present disclosure, there is provided a multilayer electronic component including: a multilayer body in which a plurality of dielectric layers and a plurality of conductor layers are alternately stacked in a stack direction; an inductor including a first conductor pattern formed of at least one of the plurality of conductor layers; and a second conductor pattern provided in the multilayer body, the second conductor pattern being not connected to other conductors in the multilayer body, the second conductor pattern being formed of a via conductor layer penetrating through at least one of the plurality of dielectric layers.

BRIEF DESCRIPTION OF THE DRAWINGS

FIG. 4A to FIG. 4D are plan views of the dielectric layers in the first embodiment;

FIG. 13A to FIG. 13C present the transmission characteristics and the reflection characteristics of the inductors A to C in simulation 2, respectively;

DETAILED DESCRIPTION

Hereinafter, embodiments of the present disclosure will be described with reference to the drawings.

First Embodiment

As a first embodiment, a low-pass filter (LPF) used in a 5G (5th Generation Mobile Communication System) communication system will be described as an example. In 5G, millimeter waves in the 28 GHz band or the like are used, and even filters with a passband of 6 GHz or lower are required to improve the attenuation characteristics from the passband to around 30 GHz.

Figure 1:
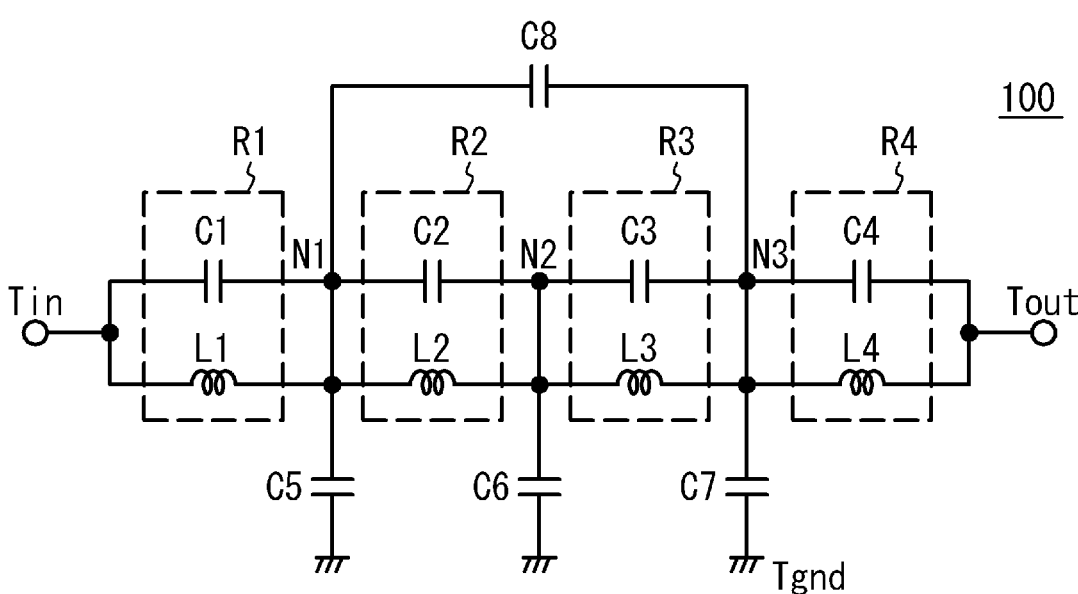
FIG. 1 is a circuit diagram of a filter in accordance with a first embodiment.

FIG. 1 is a circuit diagram of a filter in accordance with a first embodiment.

As illustrated in FIG. 1, a filter 100 according to the first embodiment includes an input terminal Tin, an output terminal Tout, a ground terminal Tgnd, capacitors C1 to C8, and inductors L1 to L4. Parallel resonant circuits R1 to R4 are connected in series between the input terminal Tin and the output terminal Tout. A node N1 is provided between the parallel resonant circuits R1 and R2, a node N2 is provided between the parallel resonant circuits R2 and R3, and a node N3 is provided between the parallel resonant circuits R3 and R4. In the parallel resonant circuit R1, the capacitor C1 and the inductor L1 are connected in parallel, in the parallel resonant circuit R2, the capacitor C2 and the inductor L2 are connected in parallel, in the parallel resonant circuit R3, the capacitor C3 and the inductor L3 are connected in parallel, and in the parallel resonant circuit R4, the capacitor C4 and the inductor L4 are connected in parallel. The capacitor C5 is connected between the node N1 and the ground terminal Tgnd, the capacitor C6 is connected between the node N2 and the ground terminal Tgnd, the capacitor C7 is connected between the node N3 and the ground terminal Tgnd. The capacitor C8 is connected between the nodes N1 and N3.

Figure 2:
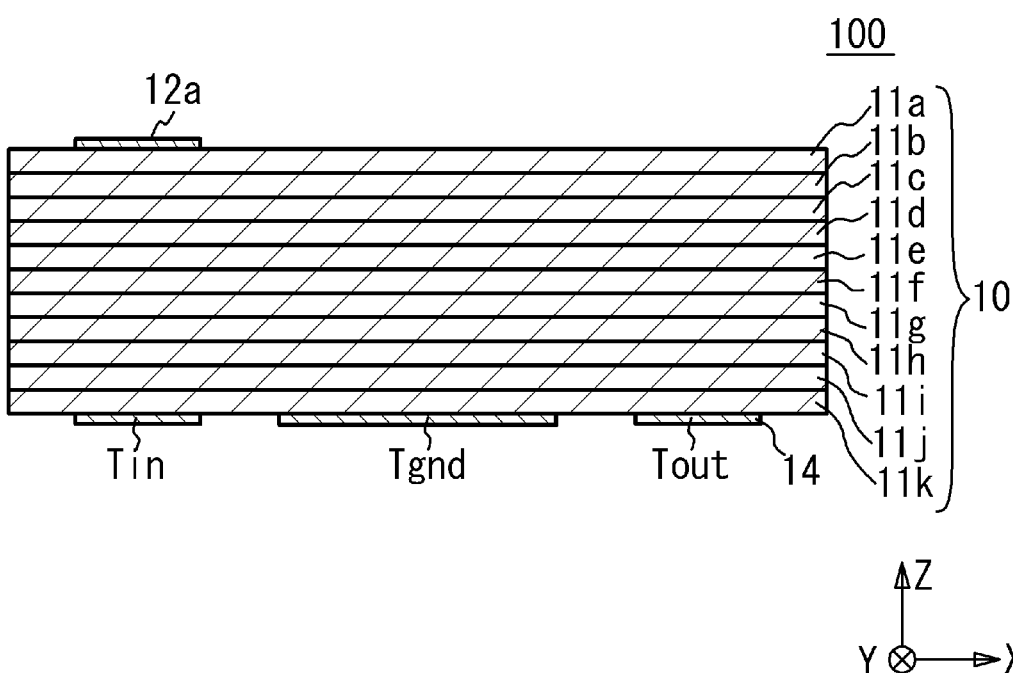
FIG. 2 is a cross-sectional view of the filter in accordance with the first embodiment.

FIG. 2 is a cross-sectional view of the filter in accordance with the first embodiment. A stack direction of dielectric layers 11a to 11k is defined as a Z direction, an arrangement direction of terminals 14 among the plane directions of the dielectric layers 11a to 11k is defined as an X direction, and a direction orthogonal to the X direction is defined as a Y direction. As illustrated in FIG. 2, the filter 100 is a multilayer electronic component including a multilayer body 10. In the multilayer body 10, a plurality of the dielectric layers 11a to 11k and a plurality of conductor layers (not illustrated) are alternately stacked. The terminals 14 are provided on the lower surface of the multilayer body 10. The terminals 14 are, for example, the input terminal Tin, the output terminal Tout, and the ground terminal Tgnd. The direction identification mark is provided on the upper surface of the multilayer body 10 by a conductor layer 12a.

Figures 4A, 4B, 4C, 4D:
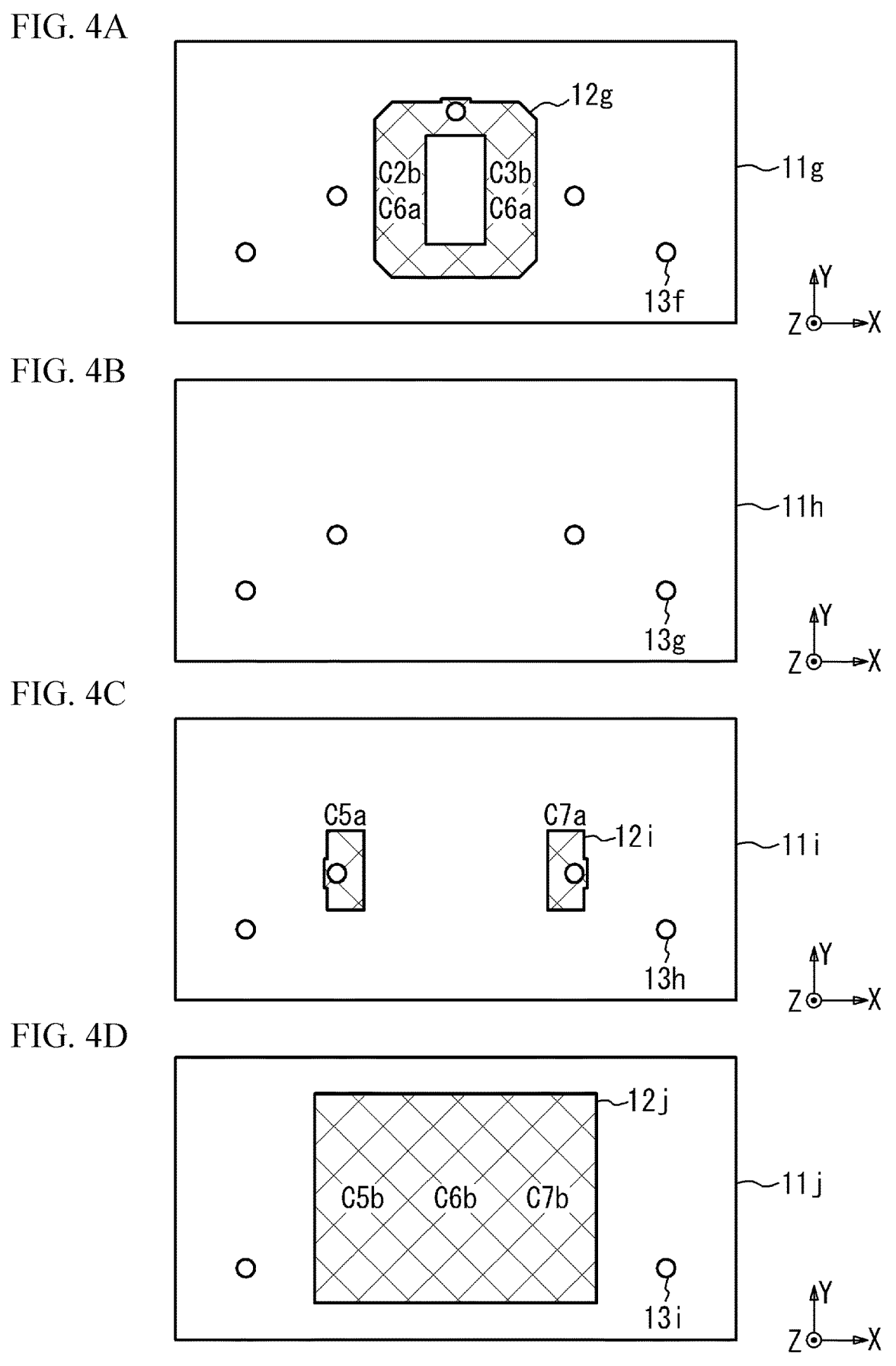
Figure 5A:
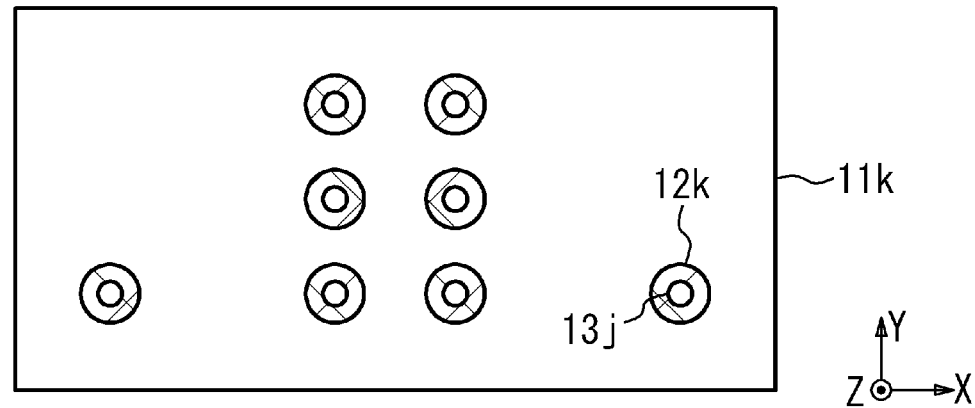
FIG. 5A and FIG. 5B are plan views of the dielectric layers in the first embodiment.
Figure 5B:
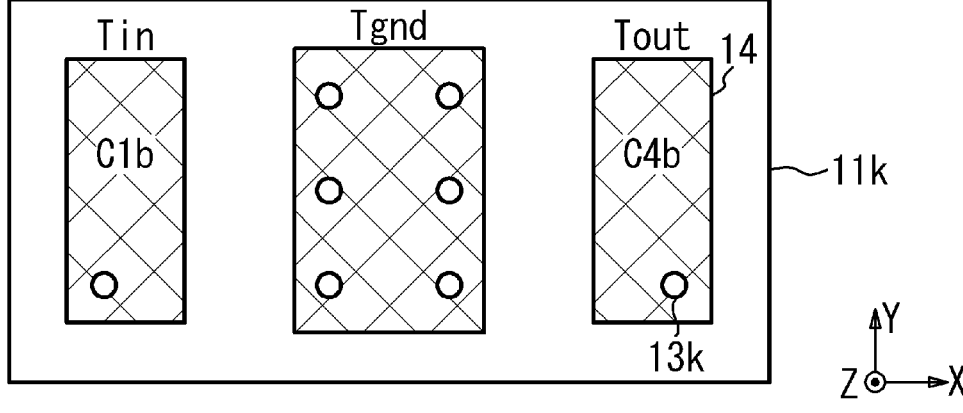

FIG. 3A to FIG. 5B are plan views of the dielectric layers in the first embodiment. FIG. 3A to FIG. 5A illustrate the upper surfaces of the dielectric layers 11c to 11k, and via wiring lines penetrating through the dielectric layers 11b to 11j, respectively. Via wiring lines 13b to 13j illustrated on the upper surfaces of the dielectric layers 11c to 11k are via wiring lines penetrating through the dielectric layers 11b to 11j one layer above the dielectric layers 11c to 11k. FIG. 5B illustrates the terminals 14 and via wiring lines 13k on the lower surface of the dielectric layer 11k as transparently viewed from above the dielectric layer 11k.

Figures 3A, 3B, 3C, 3D:
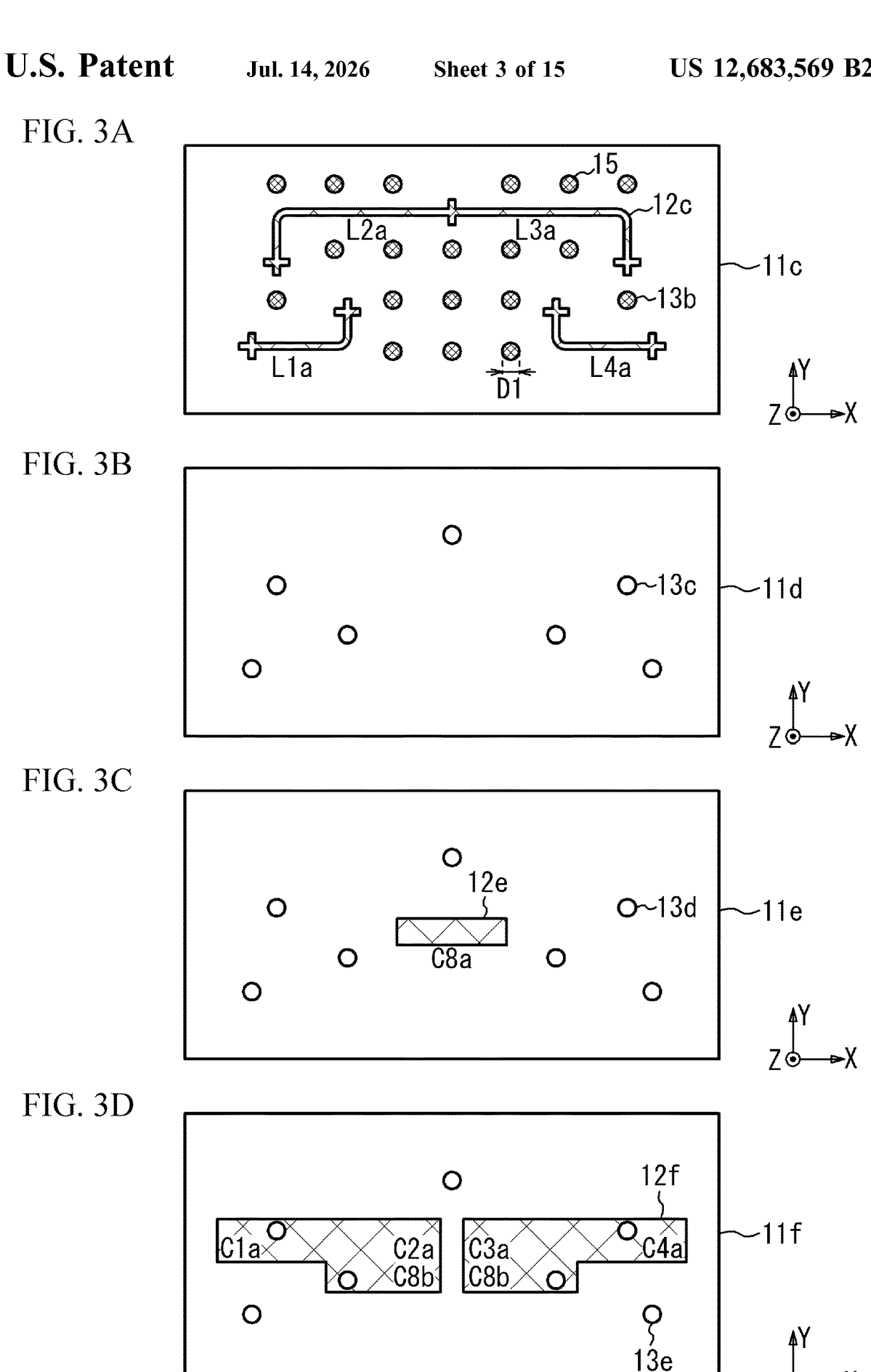
FIG. 3A to FIG. 3D are plan views of dielectric layers in the first embodiment.

For example, an electrode C1a in FIG. 3D and an electrode C1b in the input terminal Tin in FIG. 5B mean that the electrodes C1a and C1b form the capacitor C1 with the dielectric layers 11f to 11k interposed therebetween. The same applies to electrodes C2a to C8a and C2b to C8b in FIG. 3C to FIG. 4A, FIG. 4C, FIG. 4D, and FIG. 5D. The same applies to the following similar drawings.

As illustrated in FIG. 2, the conductor layer 12a that forms a direction identification mark is provided on the upper surface of the dielectric layer 11a. No via wiring line penetrating through the dielectric layer 11a is provided. No conductor layer is provided on the upper surface of the dielectric layer 11b. As illustrated in FIG. 3A, the via wiring lines 13b penetrating through the dielectric layer 11b are provided. The via wiring line 13b is a floating conductor layer 15 and is not electrically connected to a conductor layer 12c. The planar shape of the floating conductor layer 15 is circular, and the width (for example, diameter) is D1. Line patterns L1a to L4a forming the inductors L1 to L4 are provided on the upper surface of the dielectric layer 11c. The floating conductor layer 15 is a pattern for reducing diffusion of elements such as silver from the conductor layer.

As illustrated in FIG. 3B, no conductor layer is provided on the upper surface of the dielectric layer 11d. The via wiring lines 13c penetrating through the dielectric layer 11c are provided. As illustrated in FIG. 3C, a conductor layer 12e forming the electrode C8a is provided on the upper surface of the dielectric layer 11e. The via wiring line 13d penetrating through the dielectric layer 11d is provided. As illustrated in FIG. 3D, conductor layers 12f forming the electrodes C1a, C2a, C3a, C4a and C8b are provided on the upper surface of the dielectric layer 11f. The via wiring lines 13e penetrating through the dielectric layer 11e are provided.

As illustrated in FIG. 4A, a conductor layer 12g forming the electrodes C2b, C3b, and C6a is provided on the upper surface of the dielectric layer 11g. The via wiring lines 13f penetrating through the dielectric layer 11f are provided. As illustrated in FIG. 4B, no conductor layer is provided on the upper surface of the dielectric layer 11h. The via wiring lines 13g penetrating through the dielectric layer 11g are provided. As illustrated in FIG. 4C, conductor layers 12i forming the electrodes C5a and C7a are provided on the upper surface of the dielectric layer 11i. The via wiring lines 13h penetrating through the dielectric layer 11h are provided. As illustrated in FIG. 4D, a conductor layer 12j forming the electrodes C5b, C6b, and C7b is provided on the upper surface of the dielectric layer 11j. The via wiring lines 13i penetrating through the dielectric layer 11i are provided.

As illustrated in FIG. 5A, the via wiring lines 13j penetrating through the dielectric layer 11j are provided. Conductor layers 12k forming the conductor patterns connected to the via wiring lines 13j is provided on the upper surface of the dielectric layer 11k. As illustrated in FIG. 5B, the terminals 14 are provided on the lower surface of the dielectric layer 11k. The terminals 14 include the input terminal Tin, the output terminal Tout, and the ground terminal Tgnd. The input terminal Tin includes the electrode C1b, and the output terminal Tout includes the electrode C4b.

The dielectric layers 11a to 11k are made of a ceramic material and contain, for example, oxide of silicon (Si), potassium (Ca), and magnesium (Mg) (for example, $CaMgSi_2O_6$, which is a diopside crystal) as a main component. The main components of the dielectric layers 11a to 11k may be oxides other than the oxide of Si, Ca, and/or Mg. Further, the dielectric layers 11a to 11k may contain oxides of at least one of the following: titanium (Ti), zirconium (Zr), and aluminum (Al), as an insulating material.

The conductor layers 12a, 12c, 12e to 12g, 12i to 12k, the via wiring lines 13b to 13k, and the upper portions of the terminals 14 are metallic layers containing, for example, silver (Ag), palladium (Pd), platinum (Pt), copper (Cu), nickel (Ni), gold (Au), gold (Au)-palladium (Pd) alloys, or silver (Ag)-platinum (Pt) alloys as a main component. In some embodiments, the conductor layers 12a, 12c, 12e to 12g, 12i to 12k, the via wiring lines 13b to 13k, and the upper portions of the terminals 14 contain silver as an example. The upper portion of the terminal 14 may contain a non-conductive material such as $TiO_2$, $ZrO_2$, or $Al_2O_3$ in addition to the above-described metal material. The lower portion of the terminal 14 is a nickel film and a tin (Sn) film.

Comparative Example 1

Figure 6A:
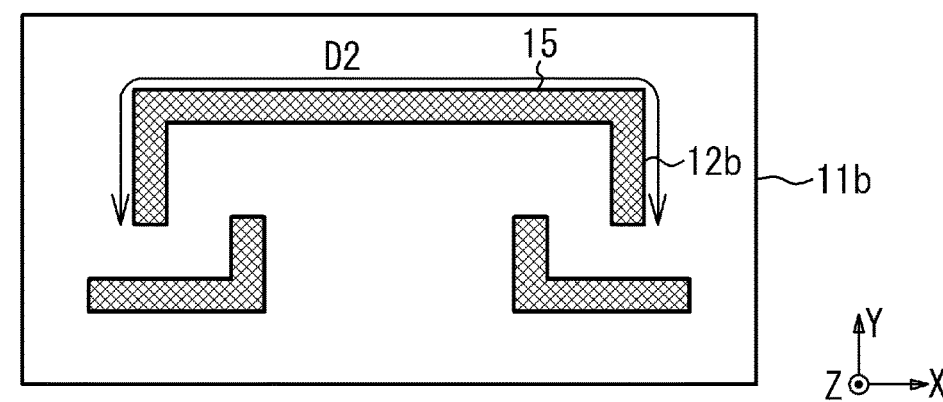
FIG. 6A and FIG. 6B are plan views of dielectric layers in a comparative example 1.
Figure 6B:
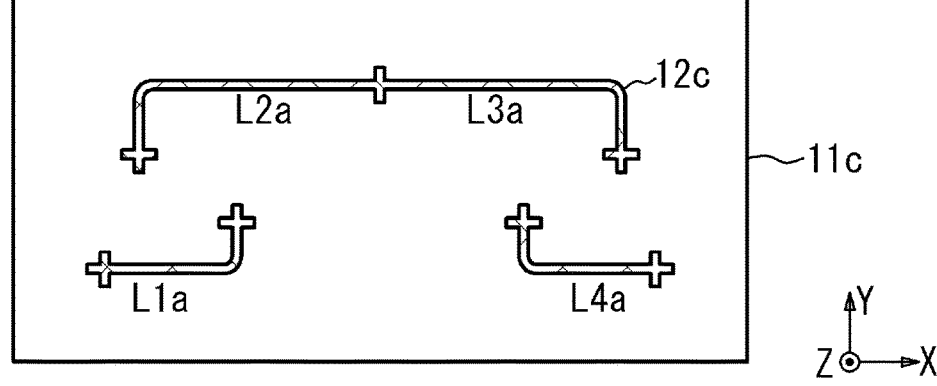

FIG. 6A and FIG. 6B are plan views of dielectric layers in a comparative example 1. As illustrated in FIG. 6A, in the comparative example 1, conductor layers 12b forming the floating conductor layers 15 are provided on the upper surface of the dielectric layer 11b. The maximum length of the floating conductor layer 15 is D2. As illustrated in FIG. 6B, the conductor layers 12c that form the line patterns L1a to L4a are provided on the upper surface of the dielectric layer 11c. No via wiring line penetrating through the dielectric layer 11b is provided. Other configurations are the same as those of the first embodiment.

Comparative Example 2

In a comparative example 2, the floating conductor layer 15 is not provided. Other configurations are the same as those of the first embodiment and the comparative example 1.
Problem of Comparative Example 2

When the main components of the conductor layers 12a, 12c, 12e to 12g, 12i to 12k, the via wiring lines 13b to 13k, and the upper portions of the terminals 14 are silver, silver may diffuse into the dielectric layers 11a to 11k due to the heat treatment for sintering the multilayer body. Therefore, the amount of silver in the dielectric layers, the via wiring lines, and the terminals decreases, and the resistances of the dielectric layers, the via wiring lines, and the terminals increase. For example, in the comparative example 2, the coefficient of variation (CV) of the resistance value between the input terminal Tin and the output terminal Tout was measured. Each of the dielectric layers 11a to 11k of the measured filter was mainly composed of $CaMgSi_2O_6$, the main components of the conductor layers 12a, 12c, 12e to 12g, 12i to 12k, and the via wiring lines 13b to 13k were silver, and the conductor layer 12c had a thickness of about 15 μm.

Figure 7A:
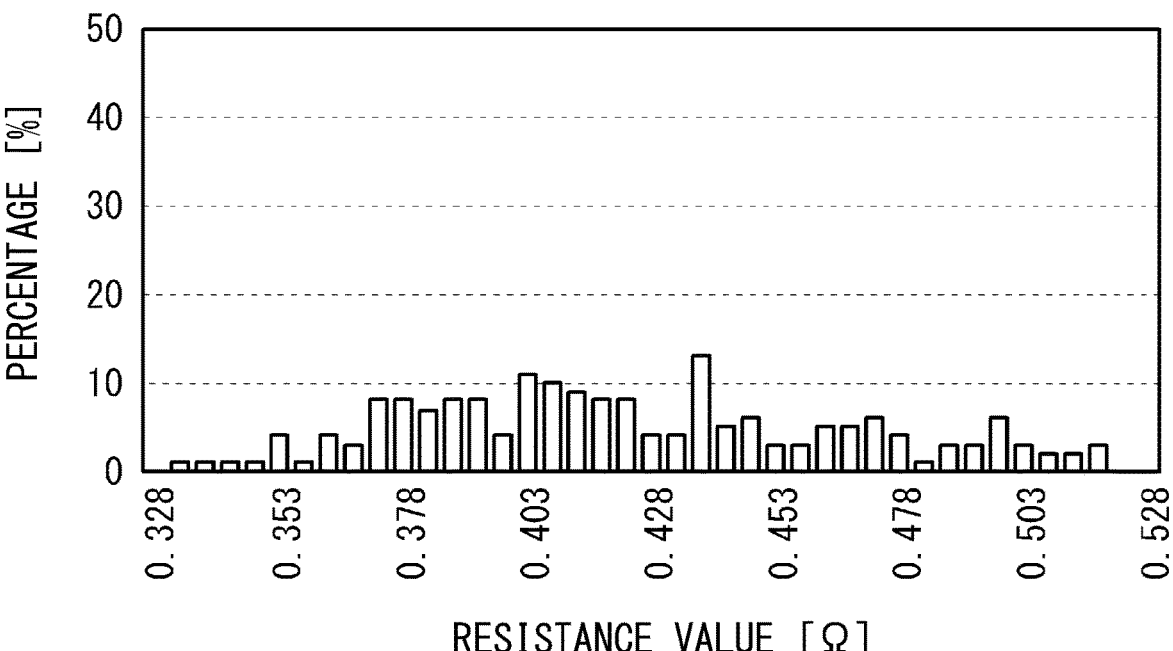
FIG. 7A and FIG. 7B present the distributions of resistance values in a comparative example 2 and the first embodiment, respectively.
Figure 7B:
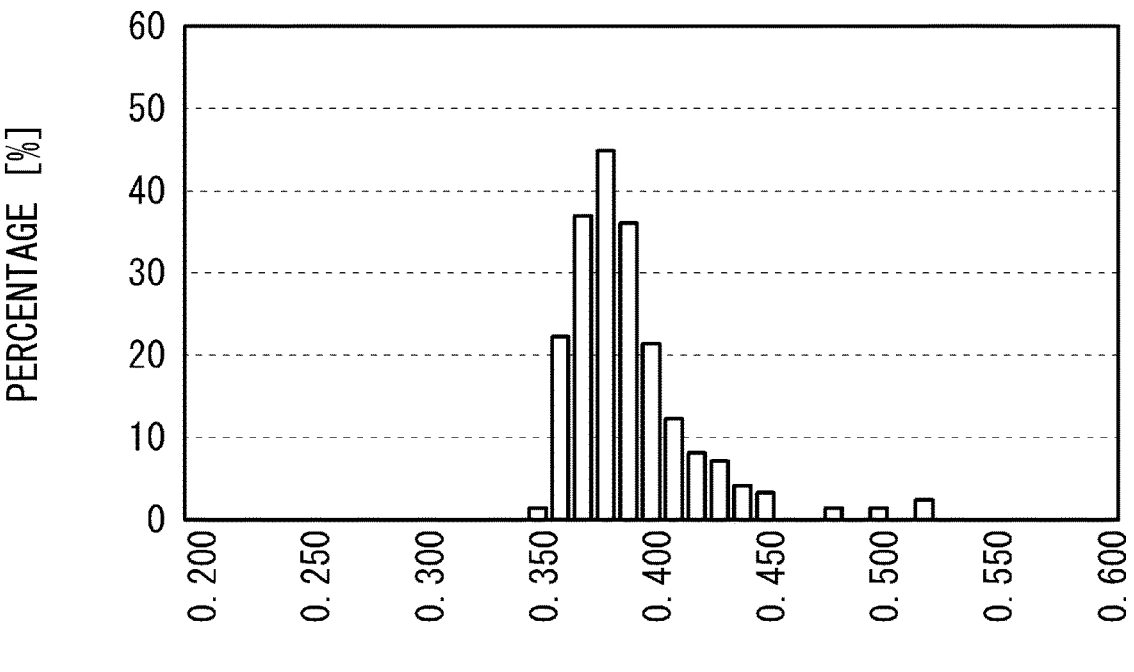

FIG. 7A and FIG. 7B are present the distributions of resistance values in the comparative example 2 and the first embodiment, respectively. The horizontal axis represents the resistance value, and the vertical axis represents the percentage of the resistance value. As illustrated in FIG. 7A, the variation in resistance value is large in the comparative example 2. The CV of the resistance value of the comparative example 2 was 10.7%. When the CV of the resistance value is large, the parasitic resistances of the inductors L1 to L4 vary.

In the comparative example 2, when the sintering temperature of the multilayer body 10 is lowered, the CV of the resistance value decreases. Therefore, it is considered that the increase in the CV of the resistance value in the comparative example 2 is mainly due to the diffusion of silver in the line patterns L1a to L4a into the dielectric layers 11b and 11c.

Figure 8:
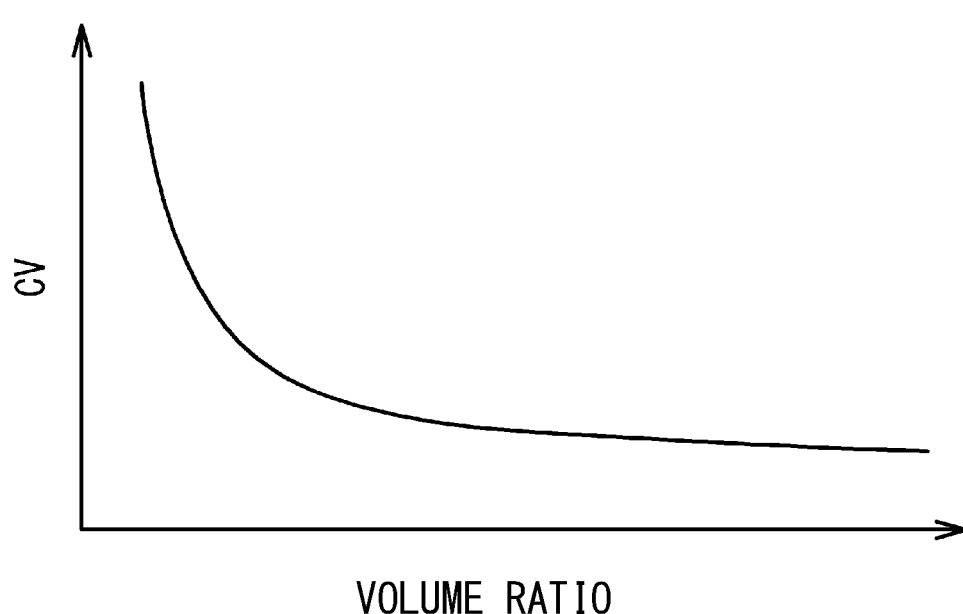
FIG. 8 is a schematic diagram illustrating the CV of the resistance value with respect to the volume ratio of the conductor layer.

FIG. 8 is a schematic diagram illustrating the CV of the resistance value with respect to the volume ratio of the conductor layer. The volume ratio on the horizontal axis indicates the ratio of the volumes of the line patterns L1a to L4a to the volume obtained by multiplying the area of the multilayer body 10 in the XY plane by a predetermined thickness (for example, 10 μm to 50 μm). The CV on the vertical axis indicates the CV of the resistance value between the input terminal Tin and the output terminal Tout. FIG. 8 is a schematic diagram illustrating the results of examining the relationship between the volume ratio and the CV of the resistance value for different filters.

As illustrated in FIG. 8, the CV value increases as the volume ratio decreases. This is because, when the volume ratio is large, the ratio of silver diffusing into the dielectric layer to silver in the conductor layer is small, but when the volume ratio is small, the ratio of silver diffusing into the dielectric layer to silver in the conductor layer is large, and thereby, a portion having a high resistance is generated in the conductor layer.

In the comparative example 2, the line patterns L1a to L4a are thin, and thus the volume ratio of FIG. 8 is small. Therefore, it is considered that silver in the line patterns L1a to L4a is easily diffused into the dielectric layers 11b and 11c, resulting in a larger CV value.

In the first embodiment and the comparative example 1, the floating conductor layer 15 is provided in the vicinities of the line patterns L1a to L4a. Therefore, it is possible to inhibit silver in the line patterns L1a to L4a from diffusing into the dielectric layers 11b and 11c. In the first embodiment, the CV of the resistance value between the input terminal Tin and the output terminal Tout was measured. The materials of the members were the same as those of the comparative example 2. The floating conductor layer 15 had a thickness of about 25 μm and a width D1 (diameter) of about 60 μm.

As presented in FIG. 7B, the variation in resistance value is smaller in the first embodiment than in the comparative example 2. The CV of the resistance value of the first embodiment was 4.9%. As described above, in the first embodiment and the comparative example 1, the variation in the parasitic resistances of the inductors L1 to L4 can be reduced.
Simulation 1

A three dimensional electromagnetic field simulation was performed on the first embodiment and the comparative examples 1 and 2 using the finite element method to simulate the pass characteristics and the reflection characteristics of the filter.

Each of the dielectric layers 11a to 11k was mainly composed of $CaMgSi_2O_6$ and had a relative permittivity of about 10. Since the frequencies handled by the filter 100 are high, such as 1 GHz to 40 GHz, the filter 100 functions like a distributed constant circuit. Therefore, the capacitances of the capacitors C1 to C8 and the inductances of the inductors L1 to L4 are not determined, but rough values of the capacitances of the capacitors C1 to C8 and the inductances of the inductors L1 to L4 of the first embodiment and the comparative examples 1 and 2 are presented in Table 1.

TABLE 1

| Capacitance [pF] | | | | | | | | Inductance [nH] | | | |
|---|---|---|---|---|---|---|---|---|---|---|---|
| C1 | C2 | C3 | C4 | C5 | C6 | C7 | C8 | L1 | L2 | L3 | L4 |
| 0.1 | 1.4 | 1.4 | 0.1 | 0.45 | 0.35 | 0.45 | 0.02 | 0.8 | 0.4 | 0.4 | 0.8 |

The floating conductor layer 15 of the first embodiment had a width D1 of 60 μm and a thickness of 25 μm. The maximum length D2 and thickness of the floating conductor layer 15 of the comparative example 1 was 1750 μm and 15 μm, respectively.

Figures 9A, 9B, 9C:
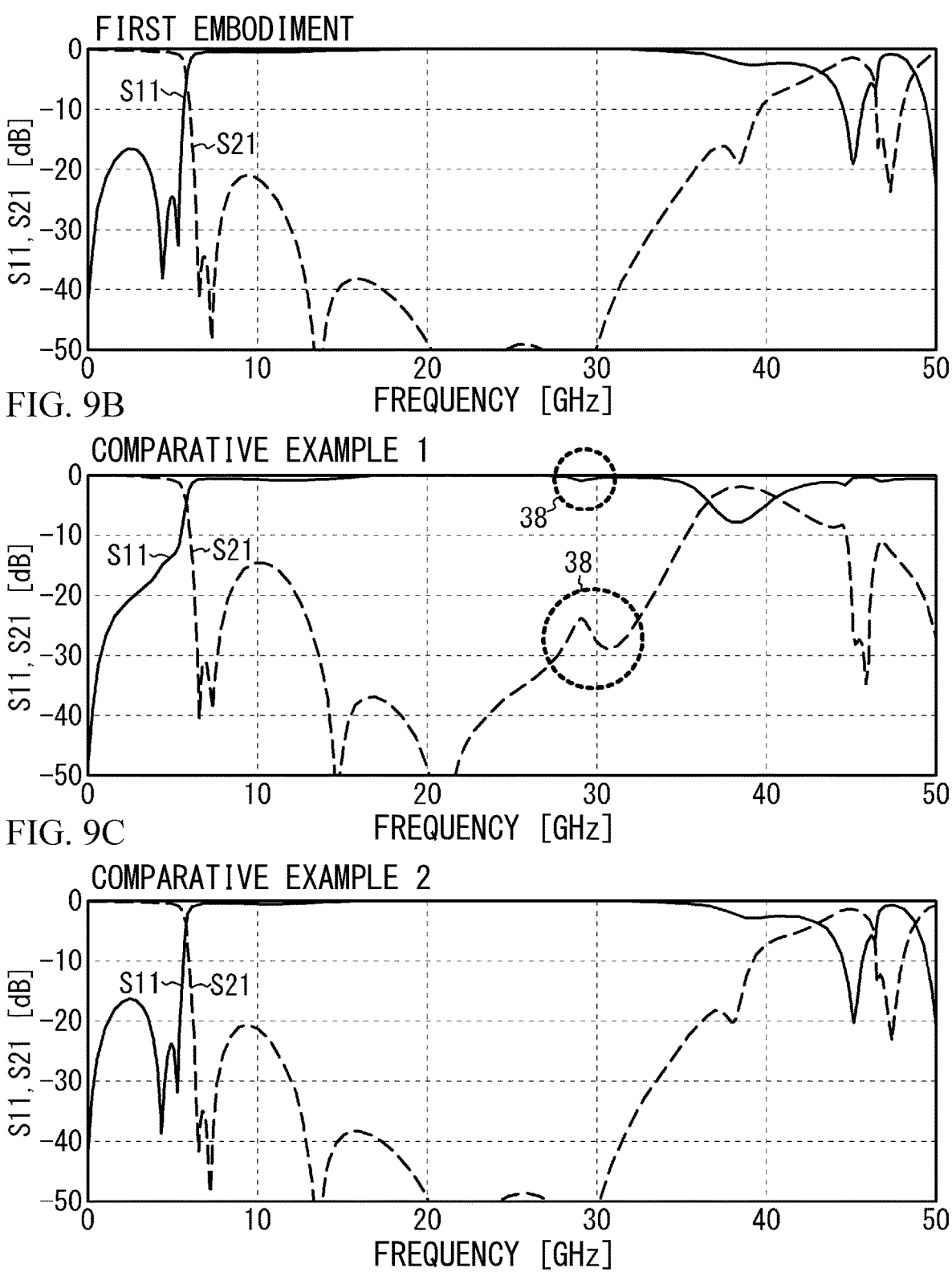
FIG. 9A to FIG. 9C present the transmission characteristics and the reflection characteristics of the first embodiment and the comparative examples 1 and 2 in simulation 1, respectively.

FIG. 9A to FIG. 9C present the transmission characteristics and the reflection characteristics of the first embodiment and the comparative examples 1 and 2 in simulation 1, respectively. The absolute value of S21 of the S parameters indicates the transmission characteristics, while the absolute value of S11 indicates the reflection characteristics.

As illustrated in FIG. 9A, when the frequency at which S21 is −3 dB is set as the cutoff frequency fc (i.e., the high-frequency end of the passband) as in the first embodiment, the cutoff frequency fc is about 5.7 GHZ. At frequencies lower than the cutoff frequency fc, S21 is approximately 0 dB, and S11 is −15 dB or less. At frequencies higher than the cutoff frequency fc, S21 is −20 dB or less and S11 is approximately 0 dB, until around 40 GHz. The passband is a band equal to or lower than the cutoff frequency fc, and the attenuation band is from the cutoff frequency fc to about 40 GHz. Four attenuation poles are formed in the attenuation band. These attenuation poles are mainly formed by the parallel resonant circuits R1 to R4. Good attenuation characteristics are obtained at around 30 GHz.

As presented in FIG. 9B, in the comparative example 1, the cutoff frequency fc is substantially the same as that of the first embodiment. As indicated by dash lines 38, S11 increases and S21 decreases around 29 GHz. Thus, the attenuation characteristics are degraded at around 30 GHz.

As presented in FIG. 9C, in the comparative example 2, the deterioration in attenuation characteristics at around 29 GHz as in the comparative example 1 is not observed. The cutoff frequency fc is about the same as that of the first embodiment. Good attenuation characteristics are obtained at around 30 GHz. As described above, in the comparative example 1, the attenuation characteristics at around 29 GHz are degraded. The deterioration in attenuation characteristics is considered to be related to the floating conductor layer 15 of the comparative example 1.

The reason why the attenuation characteristics are degraded at around 29 GHz in the comparative example 1 will be considered. The maximum length D2 of the floating conductor layer 15 in FIG. 6A is 1750 μm. Since both ends of the floating conductor layer 15 are open, resonance is generated by the floating conductor layer 15 when the length D2 is ½ of the wave length λ of the high-frequency signal. Therefore, the frequency at which the length D2 is λ/2 is calculated. When the relative permittivity of the multilayer body 10 is εr, the wave length λ at which D2=λ/2 is λ=2×D2×√εr=2×1.75×10⁻³ m×√10≈1.1×10⁻² m=11 mm. When the speed of light c is c≈3×10⁸ m/s, the frequency fs at which the wavelength is λ is fs=c/λ≈27 GHz. As described above, the frequency at which the resonance occurs when the floating conductor layer 15 is configured to be a λ/2 line is a value close to 29 GHz at which the attenuation characteristics are degraded in the comparative example 1.

In the comparative example 2, the width D1 of the floating conductor layer 15 is 60 μm. The wavelength λ at which D1=λ/2 is λ=2×D1×√εr=2×0.06×10⁻³×√10≈0.38×10⁻³ m=0.38 mm, and the frequency fs is fs=c/λ≈790 GHz. As described above, the floating conductor layer 15 of the first embodiment has almost no influence on the filter characteristics.

The low-pass filter and the bandpass filter are required to reduce deterioration in attenuation characteristics in a range between the cutoff frequency fc, which is the high-frequency end of the passband, and the frequency that is at least about two times the cutoff frequency fc. Therefore, when the maximum width of the floating conductor layer 15 is X (m), the cutoff frequency is fc (Hz), and the relative permittivity of the dielectric layers 11a to 11h is εr, the resonant frequency fr of the floating conductor layer 15 for λ/2 is fr=c/(2×X×√εr). In order to satisfy fr≥2×fc, c/(2×X×√εr)≥2×fc is satisfied, and thus X≤c/(2×2×fc×√εr)=7.5×10⁷/(fc×√εr) [m] is preferable.

In the 5G communication system, a signal of 6 GHz or less and a signal of 28 GHz are used. Therefore, the resonant frequency fr of the floating conductor layer 15 is preferably set to be equal to or greater than five times the cutoff frequency fc. Therefore, X≤c/(5×2×fc×√εr)=3×10⁷/(fc×√εr) [m] is more preferable. Further, in order to make the resonant frequency fr of the floating conductor layer 15 equal to or greater than 10 times the cutoff frequency fc, X≤c/(10×2×fc×√εr)=1.5×10⁷/(fc×√εr) [m] is more preferable.

First Variation of First Embodiment

Figure 10A:
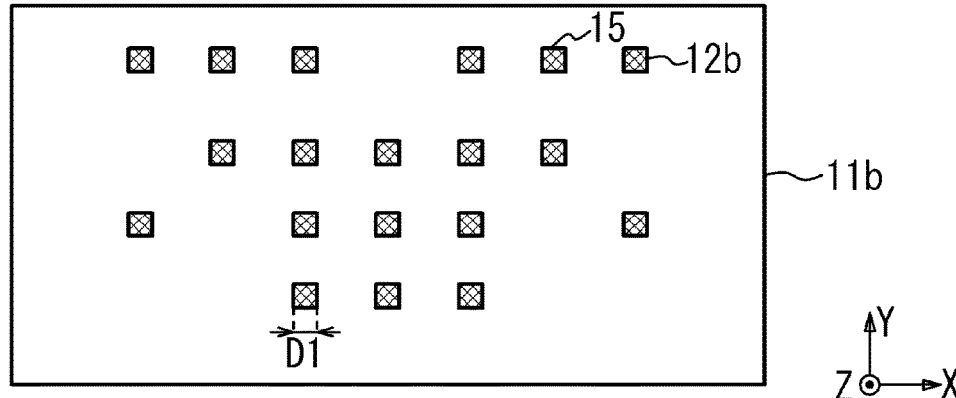
FIG. 10A to FIG. 10C are plan views of dielectric layers in a first variation of the first embodiment.
Figure 10B:
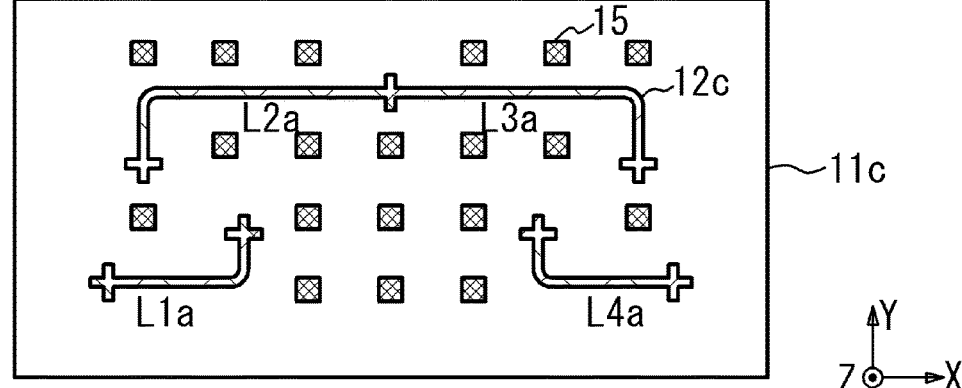
Figure 10C:
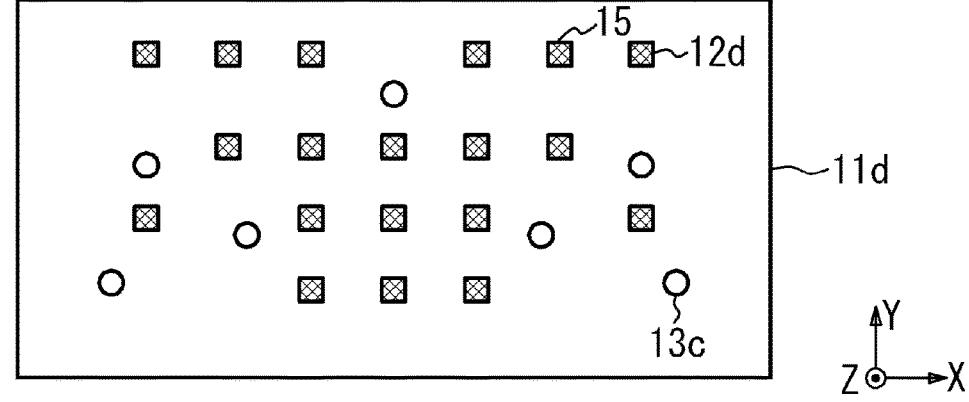

FIG. 10A to FIG. 10C are plan views of dielectric layers in a first variation of the first embodiment.

As illustrated in FIG. 10A, the conductor layers 12b forming the floating conductor layers 15 are provided on the upper surface of the dielectric layer 11b. As illustrated in FIG. 10B, the conductor layers 12c that form the line patterns L1a to L4a and the floating conductor layers 15 are provided on the upper surface of the dielectric layer 11c. No floating conductor layer formed of the via wiring line 13b penetrating through the dielectric layer 11b is provided. As illustrated in FIG. 10C, conductor layers 12d forming the floating conductor layers 15 are provided on the upper surface of the dielectric layer 11d. Although the planar shape of the floating conductor layer 15 is rectangular in the above description, the planar shape of the floating conductor layer 15 may be any shape such as a circular shape, an elliptical shape, or a polygonal shape. Other configurations are the same as those of the first embodiment, and the description thereof is omitted.

According to the first embodiment and the first variation thereof, the inductors L1 to L4 include the line patterns L1a to L4a (first conductor patterns) formed of at least one conductor layer 12c of the plurality of conductor layers. The floating conductor layer 15 (second conductor pattern) is provided in the multilayer body 10 and is not electrically connected to other conductors (for example, conductor layers and via wiring lines) in the multilayer body 10. The potential of the floating conductor layer 15 is floating. When the maximum width of the floating conductor layers 15 in the plane direction is X (m) (corresponding to D1), the cutoff frequency at the high-frequency end of the passband is fc (Hz), and the relative permittivity of a plurality of dielectric layers is εr, $X \leq 7.5 \times 10^7/(fc \times \sqrt{\varepsilon r})$ is satisfied. Thus, in the attenuation band from the cutoff frequency fc to 2fc, the deterioration in attenuation characteristics due to the λ/2 resonance of the floating conductor layer 15 can be reduced.

As in the first embodiment, the floating conductor layer 15 is formed of the via wiring line 13b (via conductor layer) penetrating through at least one dielectric layer 11b of the dielectric layers 11a to 11k. This makes it possible to reduce the width D1 of the floating conductor layer 15. In addition, the via wiring line 13b can be thickened by thickening the dielectric layer 11b. For example, the thickness of the floating conductor layer 15 can be made to be greater than the thicknesses of the line patterns L1a to L4a. Therefore, the volume of the floating conductor layer 15 can be increased. Thus, diffusion of silver from the line patterns L1a to L4a can be reduced.

The dielectric layer through which the floating conductor layer 15 penetrates is only required to be provided in at least one of the dielectric layers 11a to 11k. To reduce the diffusion of silver from the line patterns L1a to L4a, the floating conductor layer 15 is preferably provided near the line patterns L1a to L4a. Therefore, the dielectric layer through which the floating conductor layer 15 penetrates is preferably at least one of the adjacent dielectric layers 11b and 11c sandwiching the line patterns L1a and L4a therebetween. The floating conductor layer 15 penetrating through both the dielectric layers 11b and 11c may be provided. This can increase the volume of the floating conductor layer 15, and can further reduce the diffusion of silver.

As in the first variation of the first embodiment, the floating conductor layer 15 may be formed of at least one conductor layer of the conductor layers. To reduce the diffusion of silver from the line patterns L1a to L4a, the floating conductor layer 15 is preferably formed of at least one conductor layer of the conductor layers 12b to 12d. Here, the conductor layers 12c are conductor layers that form the line patterns L1a to L4a, and the conductor layers 12b and 12d are conductor layers provided on the first surfaces of the dielectric layers 11b and 11c, which are adjacent to the conductor layer 12c, opposite from the second surfaces on which the line patterns L1a to L4a are provided of the dielectric layers 11b and 11c. The floating conductor layers 15 are formed of the conductor layers 12b to 12d. This can increase the volume of the floating conductor layer 15, and can further reduce the diffusion of silver.

The floating conductor layer 15 may be formed of both the via wiring line and the conductor layer. For example, the floating conductor layers 15 formed of the conductor layers 12b to 12d may be connected through the floating conductor layers 15 penetrating through the dielectric layers 11b and 11c. This can increase the volume of the floating conductor layer 15, and can further reduce the diffusion of silver.

When a plurality of line patterns L1a to L4a are provided, a floating conductor layer penetrating through the dielectric layer adjacent to the longest line patterns L2a and L3a is preferably provided. Further, the floating conductor layer 15 is preferably formed of the conductor layers 12c including the longest line patterns L2a and L3a and the conductor layers 12b and 12d adjacent to the conductor layers 12c.

The conductor layers 12a, 12c, 12e to 12g, 12i to 12k, and the floating conductor layers 15 contain the same element as a main component. For example, when the conductor layers 12a, 12c, 12e to 12g, and 12i to 12k contain silver, diffusion of silver into the dielectric layers 11a to 11k becomes a problem. Therefore, the floating conductor layer 15 containing silver is preferably provided. The conductor layers 12a, 12c, 12e to 12g, 12i to 12k, and the floating conductor layers 15 contain, for example, silver as a main component. Here, the conductor layer and the floating conductor layer containing a certain element (e.g., silver) as a main component allow impurities to be contained in the conductor layer and the floating conductor layer intentionally or unintentionally. The concentration of the certain element (for example, silver) in the conductor layer and the floating conductor layer is, for example, 50 atomic % or greater, or 80 atomic % or greater.

When the cutoff frequency fc is low, even if the width D1 of the floating conductor layer 15 is set to be approximately the lengths of the line patterns L1a to L4a, the resonant frequency of the floating conductor layer 15 for λ/2 is sufficiently higher than the cutoff frequency fc, and the λ/2 resonance is not a significant problem. Therefore, when the cutoff frequency fc is 1 GHz or higher, more typically 2 GHz or higher, and even more typically 5 GHz or higher, the floating conductor layer 15 is preferably made smaller.

The filter is not limited to a low-pass filter, but to have the high-frequency end of the passband, it is preferable to provide a small floating conductor layer 15 in a low-pass filter or a bandpass filter.

The circuit configuration of the filter 100 is not limited to that illustrated in FIG. 1. When the input terminal Tin and the output terminal Tout are galvanically connected and an inductor is provided in a direct-current (DC) path between the input terminal Tin and the output terminal Tout, the resistance of the inductor in the DC path is an insertion loss of the filter. Therefore, when an inductor is provided in the DC path, the floating conductor layer 15 is preferably provided.

Second Embodiment

A second embodiment is an example of an inductor included in a multilayer electronic component.

Simulation 2

For inductors A to E, three dimensional electromagnetic field simulation was performed using the finite element method to simulate the transmission characteristics and the reflection characteristics of the inductors. The materials of the members are the same as those in simulation 1.

FIG. 11A to FIG. 12B are perspective views of the inductors A to E in simulation 2, respectively. In FIG. 11A to FIG. 12B, a conductor layer 12, via wiring lines 13, the terminals 14, and the floating conductor layer 15 are illustrated with the multilayer body 10 transparently illustrated. The line pattern L formed of the conductor layer 12 has the same shape as the line patterns L2a and L3a in FIG. 3A. The structures of the via wiring line 13 and the terminal 14 connected to the line pattern L are also the same as those of the first embodiment illustrated in FIG. 3A to FIG. 5B. The inductors A to C correspond to comparative examples, and the inductors D and E correspond to the second embodiment.

Figure 11A:
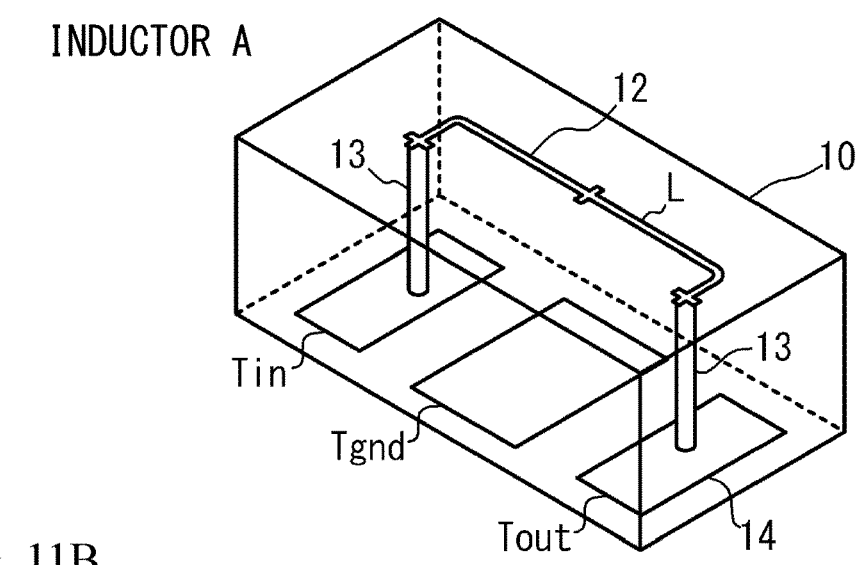
FIG. 11A to FIG. 11C are perspective views of inductors A to C in simulation 2, respectively.
Figure 11A:
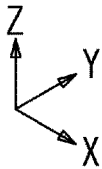

As illustrated in FIG. 11A, in the inductor A, the line pattern L formed of the conductor layer 12 is provided and no floating conductor layer 15 is provided.

Figure 11B:
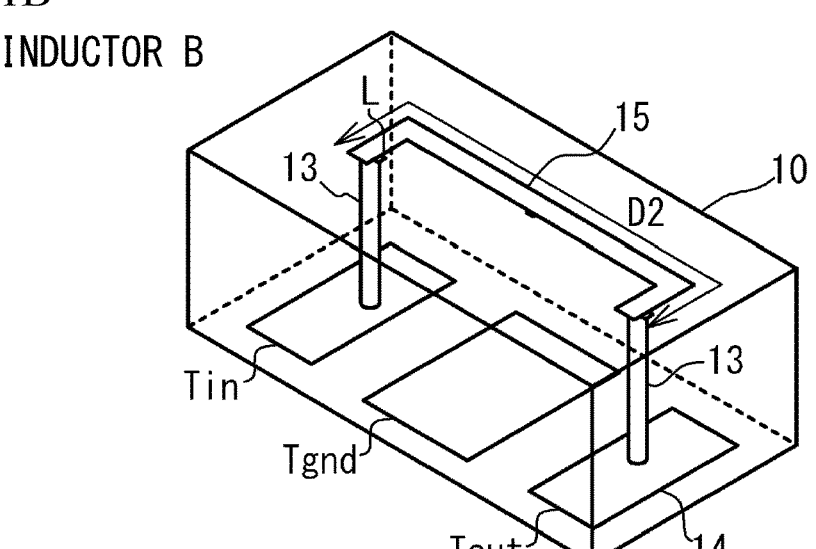
Figure 11B:
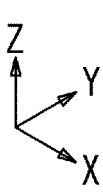

As illustrated in FIG. 11B, in the inductor B, the floating conductor layer 15 is provided above the line pattern L so as to overlap the line pattern L in a plan view with a dielectric layer interposed therebetween. The floating conductor layer 15 has a length D2 of 1750 μm and a thickness of 15 μm. The shape of the floating conductor layer 15 is the same as that in FIG. 6A.

Figure 11C:
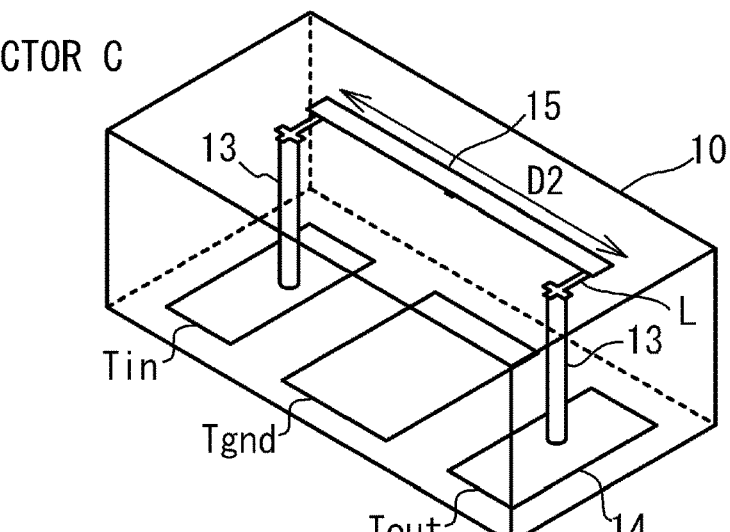
Figure 11C:
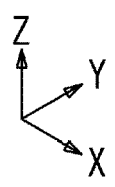

As illustrated in FIG. 11C, in the inductor C, the floating conductor layer 15 is provided above the line pattern L so as to overlap with a part of the line pattern L extending in the X direction in a plan view with a dielectric layer interposed therebetween. The floating conductor layer 15 has a length D2 of 1600 μm and a thickness of 15 μm.

Figure 12A:
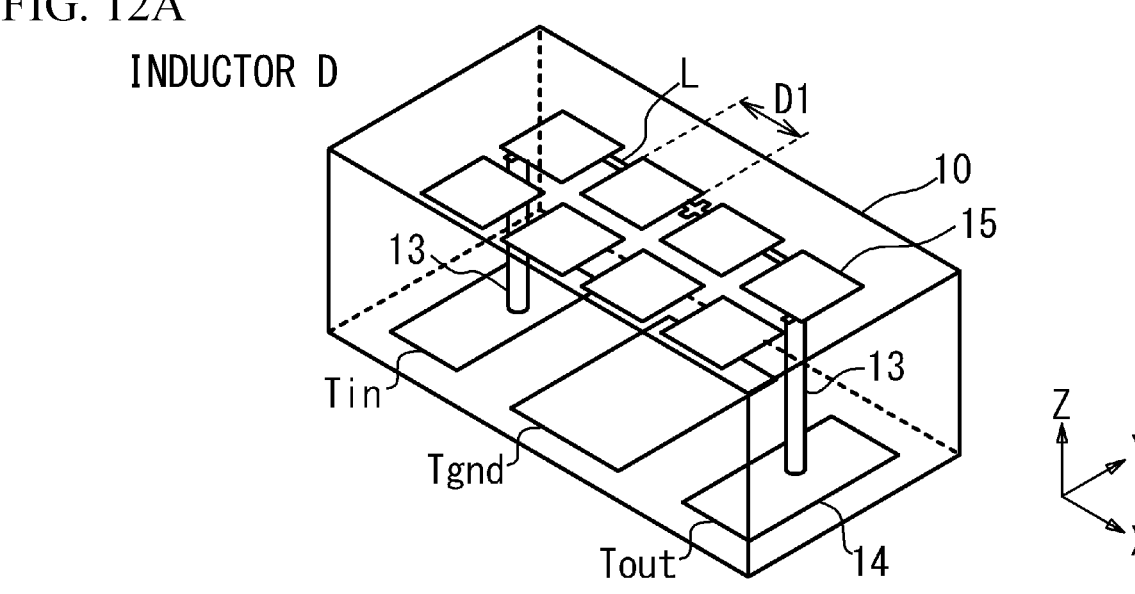
FIG. 12A and FIG. 12B are perspective views of inductors D and E in simulation 2, respectively.
Figure 12A:
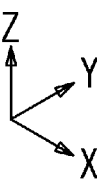

As illustrated in FIG. 12A, in the inductor D, a plurality of the floating conductor layers 15 are provided above the line pattern L with a dielectric layer interposed between the floating conductor layers and the line pattern L. A part of the floating conductor layer 15 overlaps the line pattern L in a plan view. The floating conductor layer 15 has a width D1 of 1000 μm and a thickness of 15 μm.

Figure 12B:
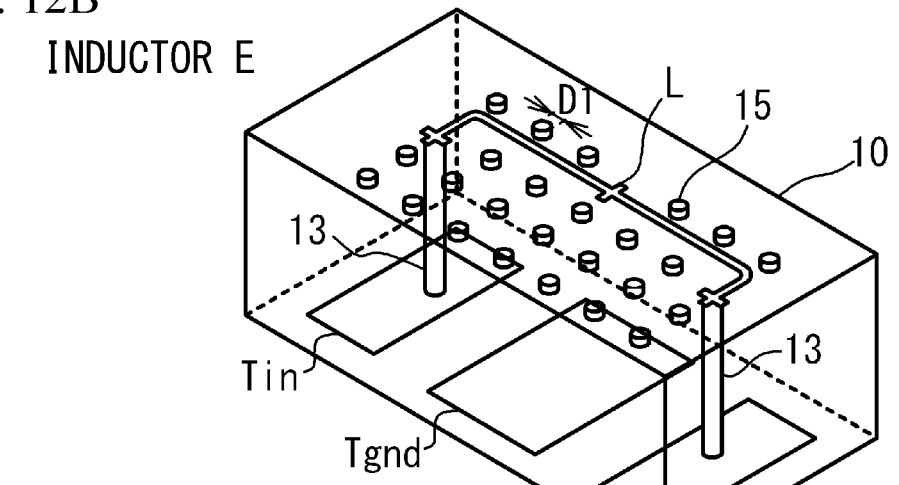
Figure 12B:
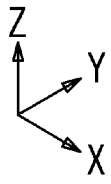

As illustrated in FIG. 12B, in the inductor E, a plurality of the floating conductor layers 15 are provided as via wiring lines that penetrate through the dielectric layer above the line pattern L. The floating conductor layers 15 do not overlap the line pattern L in a plan view. The shapes of the floating conductor layers 15 are the same as those in FIG. 3A. The floating conductor layer 15 has a width D1 of 60 μm and a thickness of 25 μm.

FIG. 13A to FIG. 14B present the pass characteristics and the reflection characteristics of the inductors A to E in simulation 2, respectively.

Figure 13A:
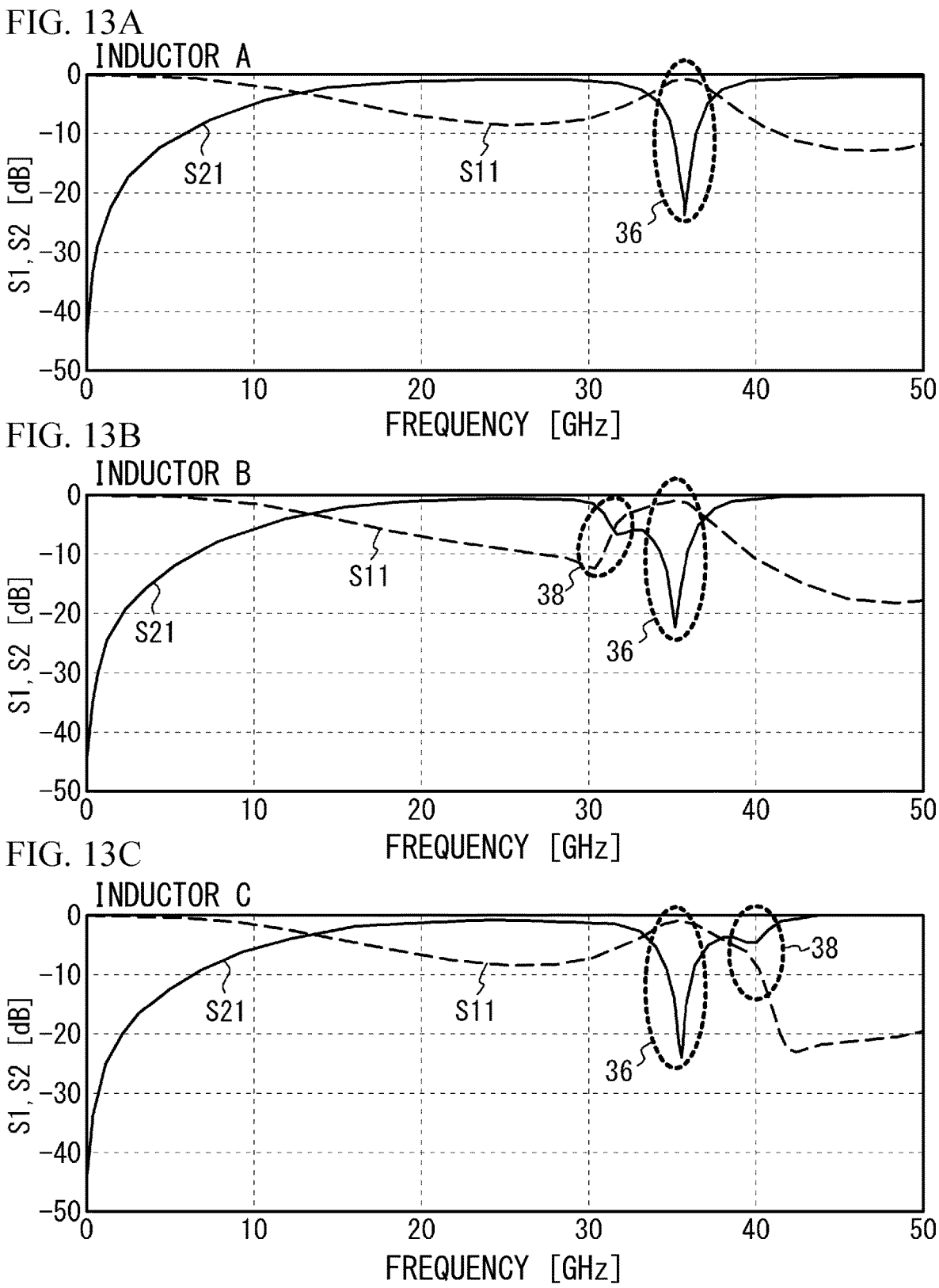

As presented in FIG. 13A, in the inductor A, as indicated by a dash line 36, an attenuation pole is formed in S21 at around 36 GHz, and a local maximum is formed in S11. This is an attenuation pole due to the self-resonant frequency of the inductor. The self-resonant frequency is a resonance due to the inductance of the inductor and the parasitic capacitance.

As presented in FIG. 13B, in the inductor B, as indicated by the dash line 36, an attenuation pole due to the self-resonant frequency of the inductor is formed at around 36 GHZ, as in the inductor A. The self-resonant frequency is slightly lower than that of the inductor A. As indicated by the dash line 38, a decrease in S21 and an increase in S11 are observed at frequencies lower than the dash line 36. This is considered to be caused by the λ/2 resonance of the floating conductor layer 15.

As presented in FIG. 13C, in the inductor C, an attenuation pole due to the self-resonant frequency of the inductor is formed at around 36 GHz as indicated by the dash line 36, as in the inductor A. As indicated by the dash line 38, a decrease in S21 and an increase in S11 are observed at frequencies higher than the dash line 36, as compared with those in the inductor A. This is considered to be due to the λ/2 resonance of the floating conductor layer 15, and it is considered that the resonance due to λ/2 is higher than that of the inductor B because the length D2 of the floating conductor layer 15 is shorter than that of the inductor B.

Figures 14A, 14B:
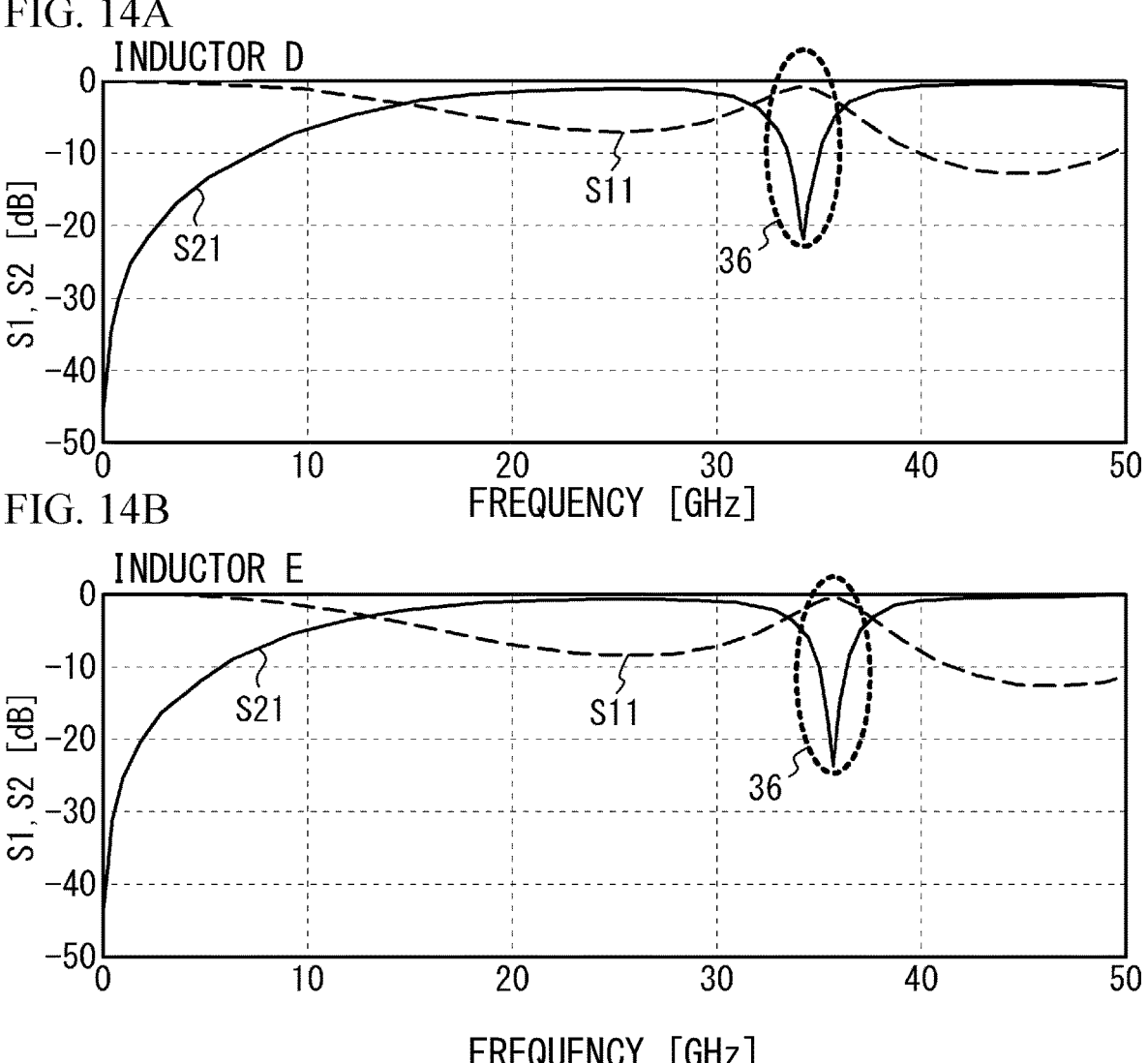
FIG. 14A and FIG. 14B present the transmission characteristics and the reflection characteristics of the inductors D and E in simulation 2, respectively.

As presented in FIG. 14A, in the inductor D, no anomalies in S21 and S11, which are considered to be caused by the λ/2 resonance of the floating conductor layer 15, are observed. This is considered to be because the frequency of the λ/2 resonance is increased due to the smaller width D1 of the floating conductor layer 15. On the other hand, the self-resonant frequency indicated by the dash line 36 is lower than those of the inductors A to C, and is about 34 GHz. This is considered to be because the line pattern L and the floating conductor layers 15 overlap each other above the ground terminal Tgnd, and thus the parasitic capacitance increases.

As presented in FIG. 14B, in the inductor E, as in the inductor D, no anomalies in S21 and S11, which are considered to be caused by the λ/2 resonance of the floating conductor layer 15, are not observed. This is considered to be because the frequency of the λ/2 resonance is increased due to the smaller width D1 of the floating conductor layer 15. The self-resonant frequency indicated by the dash line 36 is substantially the same as that of the inductor A. This is considered to be because the line pattern L and the floating conductor layer 15 do not overlap each other, and thus the inductors A and E have substantially the same parasitic capacitance.

As in simulation 2, when the floating conductor layer 15 is large, the high-frequency characteristics of the inductor deteriorate due to the λ/2 resonance of the floating conductor layer 15. The frequency at which the attenuation characteristics deteriorate due to the λ/2 resonance of the floating conductor layer 15 is preferably equal to or greater than 1.5 times the self-resonant frequency fs of the inductor. Therefore, when the maximum width of the floating conductor layer 15 is X (m), the self-resonant frequency is fs (Hz), and the relative permittivity of the dielectric layers 11a to 11h is εr, the resonant frequency fr for λ/2 is fr=c/(2×X×√εr). In order to satisfy fr≥1.5×fs, c/(2×X×√εr)≥1.5×fc is satisfied, and thus, X≤c/(1.5×2×fs×√εr)=10×10⁷/(fs×√εr) [m] is preferable. When the frequency of λ/2 is set to be equal to or greater than the cutoff frequency fc, X≤c/(2×2×fc×√εr)=7.5×10⁷/(fs×√εr) [m] is more preferable. When the frequency of λ/2 is set to be equal to or greater than five times the cutoff frequency fc, X≤c/(5×2×fc×√εr)=3×10⁷/(fs×√εr) [m] is more preferable.

In the second embodiment, when the maximum width of the floating conductive layer 15 (second conductive pattern) is X (m) (corresponding to D1), the self-resonant frequency of the inductor is fs (Hz), and the relative permittivity of the dielectric layers is εr, X≤10×10⁷/(fs×√εr) is satisfied. This can reduce the influence of the λ/2 resonance of the floating conductor layer 15 at around the self-resonant frequency of the inductor.

The floating conductor layer 15 causes an increase in parasitic capacitance of the inductor, and changes the high-frequency characteristics of the inductor, such as a decrease in the self-resonant frequency of the inductor. From this viewpoint, the floating conductor layer 15 preferably does not overlap the line pattern L when viewed from the Z direction. In the filters of the first embodiment and the first variation thereof, the floating conductor layer 15 preferably does not overlap the line patterns L1a to L4a when viewed from the Z direction.

In the first and second embodiments, the filter and the inductor are described as examples of the multilayer electronic component, but other multilayer electronic components may be used. In addition, although the floating conductor layer 15 is described as a floating conductor layer for reducing the diffusion of silver, the floating conductor layer 15 may be a floating conductor layer for other purposes.

Third Embodiment

Figure 15:
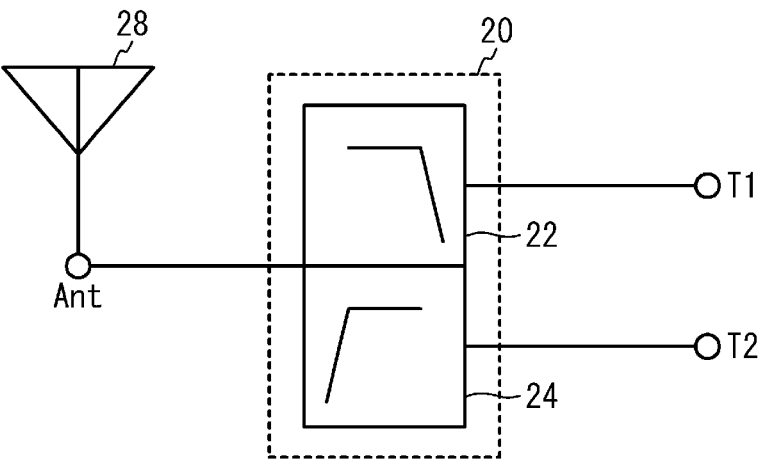
FIG. 15 is a circuit diagram of a diplexer in accordance with a third embodiment.

FIG. 15 is a circuit diagram of a diplexer in accordance with a third embodiment. As illustrated in FIG. 15, a diplexer 20 includes filters 22 and 24. The filter 22 is connected between a common terminal Ant and a terminal T1, and the filter 24 is connected between the common terminal Ant and a terminal T2. An antenna 28 is connected to the common terminal Ant. The filter 22 is, for example, a low-pass filter LPF, and allows high-frequency signals in a low band to pass therethrough and suppresses signals of other frequencies. The filter 24 is, for example, a high-pass filter HPF, and allows high-frequency signals in a high band higher than the low band in frequency to pass therethrough, and suppresses signals having other frequencies.

The filter 22 may be the filter of the first embodiment or the variation thereof. Although the example of the diplexer has been described as an example of the multiplexer, the multiplexer may be a triplexer or a quadplexer.

Although the embodiment of the present invention has been described in detail above, the present invention is not limited to the specific embodiment, and various modifications and changes can be made within the scope of the gist of the present invention described in the claims.

What is claimed is:

1. A filter comprising:

a multilayer body in which a plurality of dielectric layers and a plurality of conductor layers are alternately stacked in a stack direction;

an inductor including a first conductor pattern formed of at least one of the plurality of conductor layers; and a second conductor pattern provided in the multilayer body, the second conductor pattern being not connected to other conductors in the multilayer body, $X \leq 7.5 \times 10^7 / (fc \times \sqrt{\varepsilon r})$ being satisfied where a maximum width of the second conductor pattern is X (m), a frequency at a high-frequency end of a passband of the filter is fc (Hz), and a relative permittivity of the plurality of dielectric layers is εr.

2. The filter according to claim 1, wherein the second conductor pattern is formed of a via conductor layer penetrating through at least one of the plurality of dielectric layers.

3. The filter according to claim 1, wherein the frequency at the high-frequency end of the passband is 1 GHz or higher.

4. The filter according to claim 1, wherein the second conductor pattern does not overlap the first conductor pattern when viewed from the stack direction.

5. The filter according to claim 1, wherein the plurality of conductor layers and the second conductor pattern are mainly composed of the same element.

6. The filter according to claim 1, wherein the plurality of conductor layers and the second conductor pattern contain silver.

7. The filter according to claim 6, wherein the second conductor pattern is formed of a via conductor layer that penetrates through at least one of adjacent dielectric layers with the first conductor pattern interposed therebetween among the plurality of dielectric layers.

8. The filter according to claim 6, wherein the second conductor pattern is formed of at least one of the following: a conductor layer on which the first conductor pattern is formed, and a conductor layer provided on a first surface of a first dielectric layer adjacent to the conductor layer of the plurality of dielectric layers, the first surface being opposite from a second surface, on which the first conductor pattern is provided, of the first dielectric layer.

9. The filter according to claim 1, wherein the filter is a low-pass filter or a bandpass filter.

10. A multiplexer comprising the filter according to claim 1.

11. A multilayer electronic component comprising:

a multilayer body in which a plurality of dielectric layers and a plurality of conductor layers are alternately stacked in a stack direction;

an inductor including a first conductor pattern formed of at least one of the plurality of conductor layers; and a second conductor pattern provided in the multilayer body, the second conductor pattern being not connected to other conductors in the multilayer body, $X \leq 10 \times 10^7 / (fs \times \sqrt{\varepsilon r})$ being satisfied where a maximum width of the second conductor layer is X (m), a self-resonant frequency of the inductor is fs (Hz), and a relative permittivity of the plurality of dielectric layers is εr.

* * * * *